United States Patent
Bhatti et al.

(10) Patent No.: US 6,761,211 B2
(45) Date of Patent: Jul. 13, 2004

(54) HIGH-PERFORMANCE HEAT SINK FOR ELECTRONICS COOLING

(75) Inventors: Mohinder Singh Bhatti, Amherst, NY (US); Shrikant M. Joshi, Williamsville, NY (US); Russell S. Johnson, Tonawanda, NY (US)

(73) Assignee: Delphi Technologies, Inc., Troy, MI (US)

( * ) Notice: Subject to any disclaimer, the term of this patent is extended or adjusted under 35 U.S.C. 154(b) by 157 days.

(21) Appl. No.: 09/872,678

(22) Filed: Jun. 1, 2001

(65) Prior Publication Data

US 2001/0045270 A1 Nov. 29, 2001

Related U.S. Application Data

(63) Continuation-in-part of application No. 09/804,756, filed on Mar. 13, 2001.
(60) Provisional application No. 60/189,133, filed on Mar. 14, 2000.

(51) Int. Cl.$^7$ ................................................. F28F 7/00
(52) U.S. Cl. ....................... 165/80.3; 165/185; 257/707; 257/722; 361/703; 361/704; 361/708; 361/709
(58) Field of Search .................. 165/80.3, 185, 165/905, 907; 174/16.3; 257/722, 707; 361/703, 704, 708, 709

(56) References Cited

U.S. PATENT DOCUMENTS

| | | | | |
|---|---|---|---|---|
| 3,262,190 | A | * 7/1966 | Rostoker et al. | 29/157.3 |
| 4,222,434 | A | * 9/1980 | Clyde | 165/10 |
| 4,523,636 | A | * 6/1985 | Meijer et al. | 165/104.26 |
| 4,644,385 | A | 2/1987 | Nakanishi et al. | 357/82 |
| 4,686,606 | A | 8/1987 | Yamada et al. | 361/385 |
| 4,714,049 | A | * 12/1987 | McCoy et al. | 122/4 D |
| 4,949,164 | A | 8/1990 | Ohashi et al. | 357/82 |
| 4,977,443 | A | 12/1990 | Kobayashi et al. | 357/82 |
| 5,021,924 | A | 6/1991 | Kieda et al. | 361/385 |
| 5,123,982 | A | * 6/1992 | Kuzay | 156/89 |
| 5,205,353 | A | * 4/1993 | Willemsen et al. | 165/170 |
| 5,304,845 | A | * 4/1994 | Lindquist et al. | 257/722 |
| 5,315,154 | A | * 5/1994 | Elwell | 257/707 |
| 5,349,831 | A | 9/1994 | Daikoku et al. | 62/376 |
| 5,623,828 | A | * 4/1997 | Harrington | 62/3.2 |
| 5,666,269 | A | * 9/1997 | Romero et al. | 361/699 |
| 5,727,622 | A | 3/1998 | Gurevich et al. | 165/80.3 |
| 5,751,062 | A | 5/1998 | Daikoku et al. | 257/722 |
| 5,754,401 | A | * 5/1998 | Saneinejad et al. | 361/705 |
| 5,774,334 | A | 6/1998 | Kawamura et al. | 361/699 |
| 5,923,086 | A | 7/1999 | Winer et al. | 257/713 |
| 5,959,351 | A | 9/1999 | Sasaki et al. | 257/714 |
| 6,424,529 | B2 | * 7/2002 | Eesley et al. | 361/703 |
| 2002/0108743 | A1 | * 8/2002 | Wirtz | 165/185 |

FOREIGN PATENT DOCUMENTS

| | | | | |
|---|---|---|---|---|
| JP | 60-162195 | * | 8/1985 | F28F/3/08 |
| KR | 2001035209 A | * | 5/2001 | F28F/3/00 |
| SU | 1725423 A1 | * | 4/1992 | H05K/7/20 |

* cited by examiner

*Primary Examiner*—Henry Bennett
*Assistant Examiner*—Nihir Patel
(74) *Attorney, Agent, or Firm*—Patrick M. Griffin (57) ABSTRACT

Heat sinks are provided that achieve very high convective heat transfer surface per unit volume. These heat sinks comprise a spreader plate having a recessed area on one surface and a flat area on another surface, at least two fins and porous reticulated foam blocks having intervening gaps that fill the width and at least a portion of the length between the fins. The foam block may be a continuous single block within the space between two adjacent fins along the length of the fins or may be an array of short-length blocks having intervening gaps along the length of the fins.

13 Claims, 4 Drawing Sheets

HIGH-PERFORMANCE HEAT SINK FOR ELECTRONICS COOLING

CROSS-REFERENCE TO RELATED APPLICATIONS

This application is a continuation-in-part of U.S. patent application Ser. No. 09/804,756, filed Mar. 13, 2001 which claims benefit of Ser. No. 60/189,133, filed Mar. 14, 2000.

TECHNICAL FIELD

The present invention is directed to heat sinks primarily for use in dissipating waste heat generated by electrical and/or electronic components and assemblies. These heat sinks include a heat spreader plate and an assembly of heat conducting fins and reticulated foam structures that are bonded together. The foam block may be a continuous single block within the space between two adjacent fins along the length of the fins or may be an array of short-length blocks having intervening gaps along the length of the fins. Electronic components are connected to one surface of the spreader plate with the assembly of fins and foam connected to another surface of the spreader plate in contact with a cooling fluid.

BACKGROUND OF THE INVENTION

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

Figure 1:
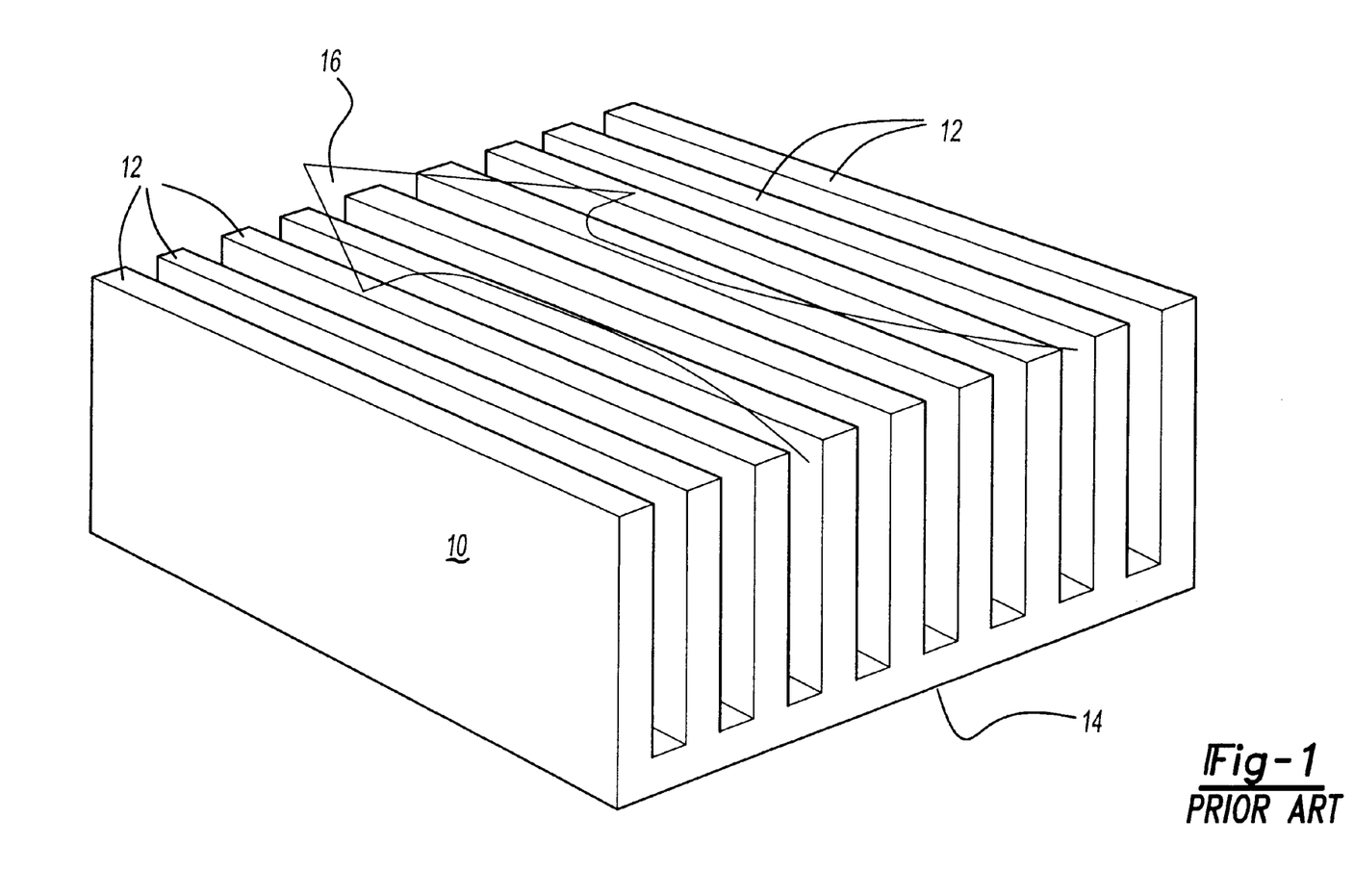
FIG. 1 shows a typical heat sink of the prior art.

At the component level, various types of heat exchangers and heat sinks have been used that apply natural or forced convection or other cooling methods. A typical heat sink for electrical or electronic components is depicted in FIG. 1. As shown, the heat sink 10 includes a heat spreader plate 14 to which metal fins 12 are attached. An electronic component is attached to spreader plate 14 and a cooling fluid 16, such as air or water, is passed across fins 12 to dissipate the heat generated by the electronic component. For a given power level to be dissipated, the spreader plate size (i.e., area) and the fin length along the length of the cooling flow path can be calculated using known methods. Fin spacing and fin height are usually determined by known methods such as numerical modeling.

In heat sinks for low power density microelectronics such as computer chips, the chip is bonded directly onto the heat sink via an interface. More advanced heat sinks for high power density computer chips employ a separate spreader plate onto which is bonded the chip via an interface. The spreader plate/chip assembly is then bonded onto the heat sink via another interface. The presence of two interfaces significantly increases the overall thermal resistance to heat transfer from the chip to the coolant flow.

In demanding applications, the method of heat exchange is usually forced convection to the cooling fluid. In such systems, heat exchange can be improved by increasing the fin surface area exposed to the cooling fluid. This is accomplished by increasing the number of the fins per unit volume. However, there are limitations to achievable fin densities based upon manufacturing constraints and cooling fluid flow requirements.

Reticulated foams are also known in the art for their ability to conduct heat such as the metal foams disclosed in U.S. Pat. Nos. 3,616,841 and 3,946,039 to Walz, and the ceramic foams disclosed in U.S. Pat. No. 4,808,558 to Park et al. Metal foams have been sold under the trade name DUOCEL available from Energy Research and Generation, Inc., Oakland, Calif.

Until recently, metal and ceramic reticulated foams have not been adapted for use in heat sinks for dissipating waste heat from electronic components. However, these structures, especially when comprised of metal, make excellent heat exchangers because of their conductivity and their extremely high surface area to volume ratio. While earlier porous heat exchangers had up to 100 open cells per square inch, reticulated foam has up to 15,625 open cells per square inch. Reticulated foam is far more porous and has far more surface area per unit volume (1600 square feet/cubic foot) than heat exchangers having other structures. The pressure drop of fluids flowing through reticulated foam is also relatively low so that movement of a cooling fluid through the foam is practical.

Studies by Bastawros have now shown the efficacy of metallic foams in forced convection heat removal for cooling of electronics. See, Bastawros, A. -F., 1998, *Effectiveness of Open-Cell Metallic Foams for High Power Electronic Cooling*, ASME Conf. Proc. HTD-361-3/PID-3, 211–217, and Bastawros, A. -F., Evans, A. G. and Stone, H. A., 1998, *Evaluation of Cellular Metal Heat Transfer Media*, Harvard University report MECH 325, Cambridge, Mass. Bastawros demonstrated that the use of metallic foam improved heat removal rate with a moderate increase in the pressure drop. Bastawros' results were based on thermal and hydraulic measurements (on an open cell aluminum alloy foam having a pore size of 30 pores per inch) used in conjunction with a model based upon a bank of cylinders in cross-flow to understand the effect of various foam morphologies. The model prediction was extrapolated to examine the trade-off between heat removal and pressure drop. The measurements showed that a high performance cellular aluminum heat sink (i.e., aluminum foam) removed 2–3 times the usual heat flux removed by a pin-fin array with only a moderate increase in pressure drop.

SUMMARY OF THE INVENTION

A range of new heat sinks for electrical and electronic components is herein presented that provides for space-efficient heat exchange with low thermal resistance. These heat sinks are capable of removing the increased waste heat flux generated by today's higher power electronic systems.

In general, heat sinks of the present invention comprise a spreader plate, at least two fins and at least one porous reticulated foam block that fills the space between the fins. The foam block may be a continuous single block within the space between two adjacent fins along the length of the fins or may be an array of short-length blocks having intervening gaps in-between the blocks along the length of the fins. All materials are made from a heat conducting material. The fins and foam blocks form an assembly that is connected to one surface of the spreader plate. Electronic components to be cooled are preferably connected to an opposing surface of the spreader plate, but may be connected to any surface of the spreader plate suited for heat transfer.

In the present invention, the preferred dimensional length is defined for the foam blocks used, whether they comprise continuous single foam blocks (hereinafter referred to as "continuous block") or an array of short-length foam blocks (hereinafter referred to as "interrupted block") along each fin length. The present invention also defines a relationship for determining the optimum interrupted block length when such an array is selected. The present invention further defines the preferred dimensional relationships for establishing the optimum fin spacing and fin height for the heat sinks provided herein. Devices produced using these dimensional relationships find particular use in cooling microelectronic components such as microprocessors.

DESCRIPTION OF THE PREFERRED EMBODIMENT

By the present invention, it has been discovered that heat sinks that use a combination of solid non-porous fins and highly porous reticulated foam can provide improved performance over known applications that use one or the other. It is fully contemplated that any combinations of fins and reticulated foam may be used in a wide variety of different applications to achieve improved cooling.

It has been further discovered that there are constraints on the volume and geometry of reticulated foam beyond which the use of additional foam will have little impact on the overall heat sink's ability to dissipate thermal power at a given flow rate (i.e., the performance). This is because the reticulated foam is not a fully dense material (e.g., aluminum foam has a density of about 10% of solid aluminum). Therefore, a high convective heat transfer surface area is achieved at the expense of reduced thermal conductivity.

Additionally, in microelectronic cooling applications such as for example for microprocessors, practical considerations relative to package size, air flow rate, pressure drop and noise limits can impose further constraints on possible configurations and dimensions. Nonetheless, using the methods of the present invention, suitable heat sinks can be produced.

Figure 2A:
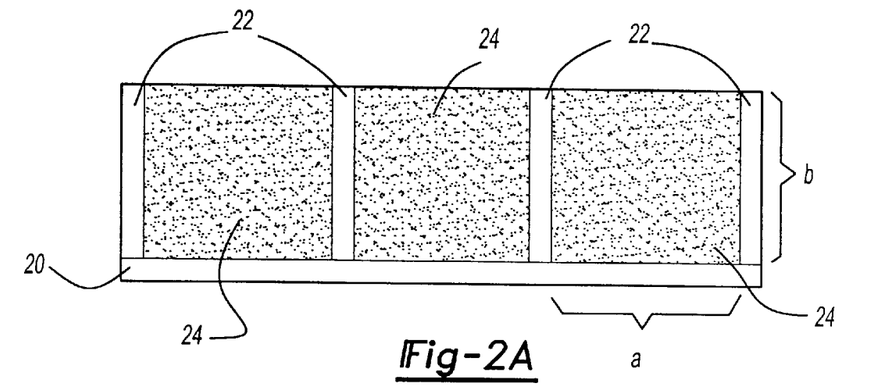
FIGS. 2A and 2B show the plane and elevation views of an improved heat sink of the present invention that comprise continuous (single foam) blocks.
Figure 2B:
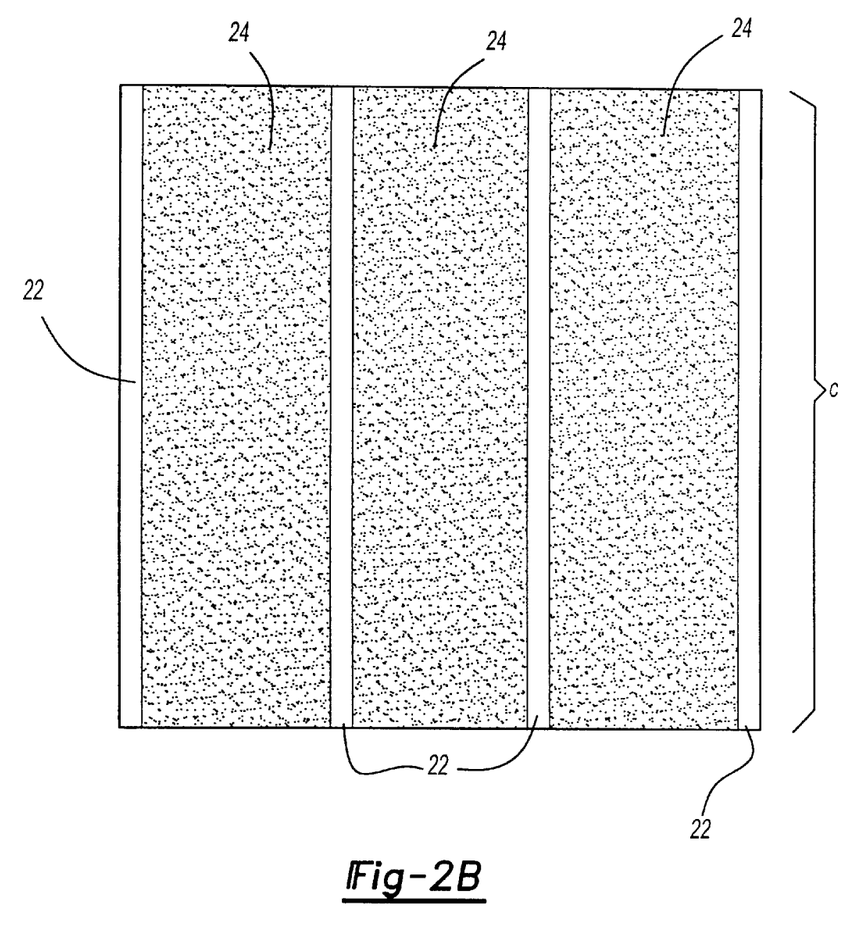
Figure 3A:
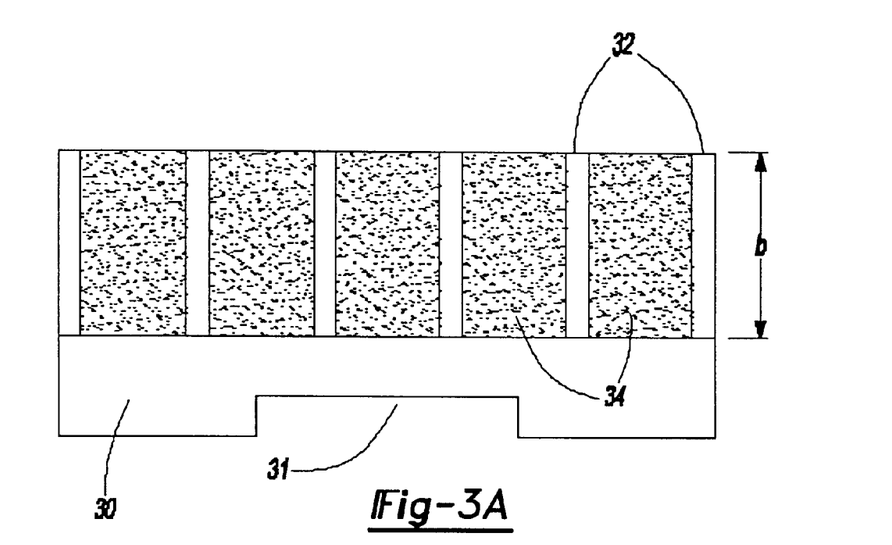
FIGS. 3A and 3B show the plane and elevation views of an improved heat sink of the present invention that comprise arrays of (short-length foam) interrupted blocks.
Figure 3B:
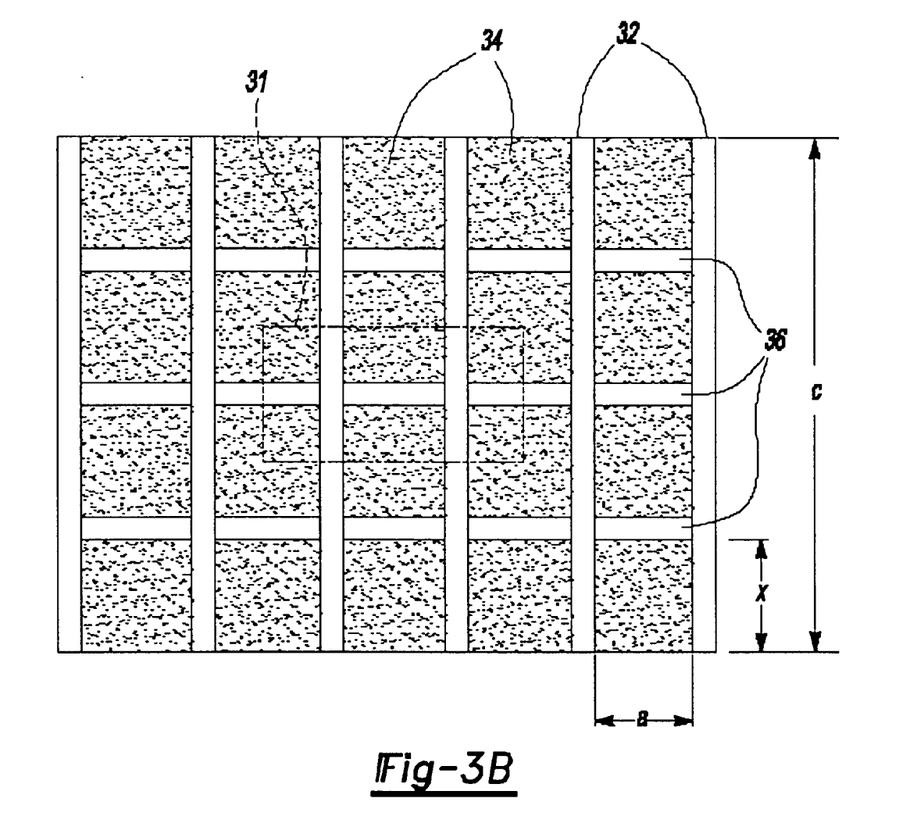

Heat sinks of the present invention achieve very high convective heat transfer surface per unit volume. These heat sinks comprise a spreader plate, at least two fins and at least one porous reticulated foam block that fill the space between the fins. The foam block may be continuous blocks that fill the space between two adjacent fins along the length of the fins, as shown in FIGS. 2A and 2B, or may be an arrays of interrupted blocks having gaps in-between successive blocks along the length of the fins, as shown in FIGS. 3A and 3B. This basic structure may be expanded to any configuration comprising foam blocks in between at least two fins that are mounted onto the surface of a spreader plate. Primary heat transfer to the cooling fluid is by convection from the foam, with the fins and spreader plate being used to conduct heat from the connected heat source (i.e., the electronic component) into the foam. In air heat exchange (i.e., where air is being used as the cooling fluid), ambient air may be drawn in through the foam's open vertical side walls and exhausted through the foam's top surface, or vice versa.

A preferred embodiment of the present invention is shown in FIG. 2A and FIG. 2B. As shown, the device comprises a heat spreader plate 20, with fins 22 and reticulated foam blocks 24 filling the space in-between the fins. The fins 22 and foam blocks 24 form an assembly that is mounted onto one surface of the spreader plate 20, leaving an opposing surface free for contact with an electronic component to be cooled.

Referring to FIG. 2A, fins 22 are mounted so that they are substantially perpendicular to the spreader plate 20. Foam blocks 24 are mounted in-between fins 22 to fill the width region that defines the horizontal space between adjacent fins. The foam blocks 24 also preferably fill the height region that defines the vertical space between adjacent fins to the height of the fins 22.

Figure 4A:
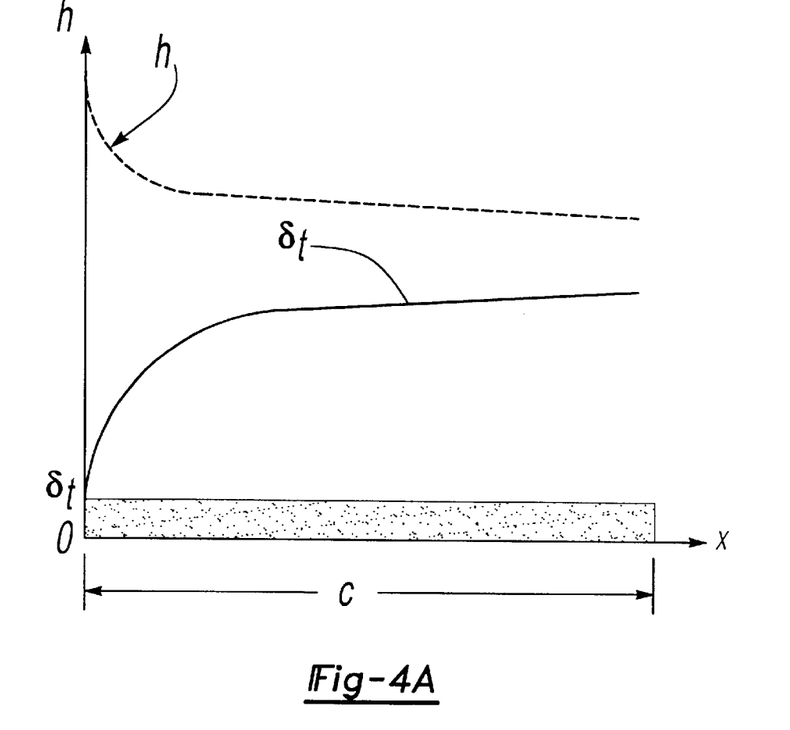
FIGS. 4A and 4B are graphs that show the heat transfer characteristics of continuous blocks and interrupted blocks.
Figure 4B:
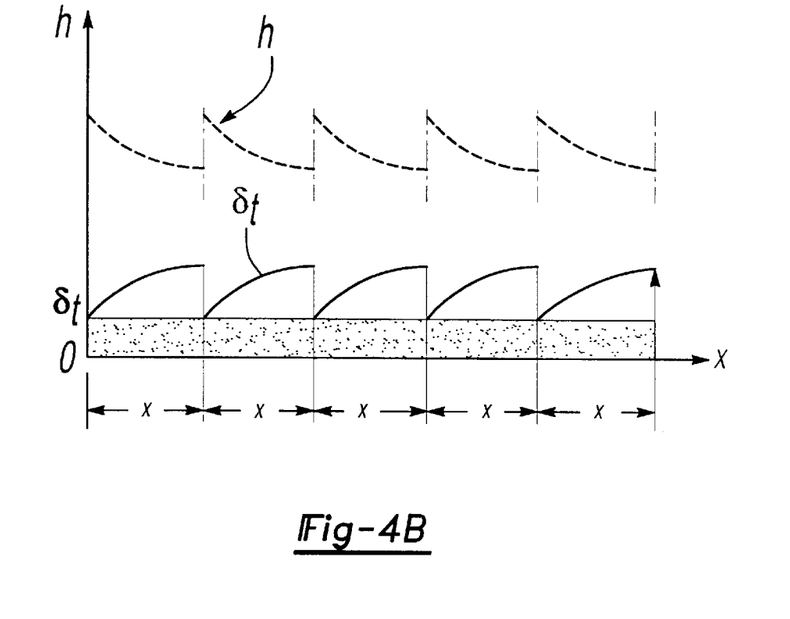

Although the foam blocks are an open-cell material, it has been found that heat transfer through the reticulated foam follows the heat transfer characteristics of a solid substrate material bonded to foam as depicted in FIGS. 4A and 4B. The upward sloping solid line in FIG. 4A (lower curve) shows the growth of the thermal boundary layer thickness $\delta_t$ on a substrate with a long foam block of length c in the flow direction indicated by the arrow. The downward sloping dashed line in FIG. 4A (upper curve), on the other hand, shows the variation of the heat transfer coefficient h over the same foam block. The opposing trends of the two curves indicate that as the thermal boundary thickness increases, the heat transfer coefficient decreases. In other words, as the thermal boundary thickness increases, the resistance to heat transfer increases since the thermal boundary layer thickness is a direct measure of resistance to heat transfer. The smaller the boundary layer thickness the smaller is the resistance to heat transfer.

The upward sloping solid lines in FIG. 4B (lower curves) show the growth of the thermal boundary layers on a substrate with an array of short foam blocks each of length x in the flow direction indicated by the arrow. The dotted lines in FIG. 4B (upper curves), on the other hand, show the variation of the heat transfer coefficient h over the same array of foam blocks. This heat transfer coefficient curve resembles a saw tooth wave. The saw tooth nature of the heat transfer coefficient curve is due to repeated interruption of the fluid flow at the trailing edge of each short foam block, since the thermal boundary layer starts developing anew at the leading edge of the succeeding foam block. Thus, the overall thermal boundary layer thickness $\delta_t$ never gets a chance to grow very thick and consequently the heat transfer coefficient remains fairly high over the entire length of the solid substrate. By appropriately selecting the foam block length x, the heat transfer rate from the substrate can be maintained at the desired level.

Therefore, according to an alternative embodiment of the present invention, an array of short blocks of foam, or "interrupted" blocks, are used to select the desired heat transfer. Formulas to establish the preferred length of such interrupted blocks are provided herein. While the formulas define the preferred upper and lower thresholds for the length, longer or shorter lengths are also contemplated. In addition, lengths approaching the lower threshold are more preferred.

The alternative embodiment of the present invention is shown in FIG. 3A and FIG. 3B. As shown, the device comprises a heat spreader plate 30 that preferably includes a recessed area 31 suitable for placement and attachment of a microelectronic component such as a computer chip. The recessed area 31 eliminates the typical interface between the heat sink and the spreader plate used for high power density chips, thereby reducing the overall thermal resistance to heat transfer from the chip to the coolant flow. As further shown, the device comprises fins 32 and arrays of interrupted blocks 34 having gaps 36 in-between that fill the space between the width of the fins and along at least a portion of the flow length of the fins. While it is preferred that the interrupted blocks are all of approximately equivalent length, it is contemplated that the blocks at each end may be shorter than any other blocks to accommodate for sizing of the selected spreader plate. The fins 32 and interrupted blocks 34 form an assembly that is mounted onto surface of spreader plate 30 that is opposite to the surface having the recessed area 31.

Referring to FIG. 3A, fins 32 are mounted so that they are substantially perpendicular to the spreader plate 30. Interrupted blocks 34 are mounted in-between fins 32 to fill the width region that defines the horizontal space between adjacent fins leaving a gap 36 between successive interrupted blocks along the flow length of the fins as shown in FIG. 3B. The gap 36 between successive interrupted blocks is unimportant, but it is preferred that the gap 36 be as small as possible. The interrupted blocks 34 also preferably fill the height region that defines the vertical space between adjacent fins to the height of the fins 32.

While FIG. 2A and FIG. 3A depict foam blocks 24 and interrupted blocks 34 that fill the height region, it is contemplated that in alternative embodiments the blocks may partially fill or overfill the height region.

Referring to FIGS. 2B and 3B, heat sinks of the present invention are configured such that the fins 22 and 32 are substantially parallel to one another and aligned along the length of the spreader plate 20 and 30, respectively.

The selection of spreader plate size and fin length along the cooling flow length, for a given power dissipation requirement, follow those techniques known in the art. The overall dimensions of the spreader plate are generally fixed based on the amount of heat to be dissipated from the surface of the heat source (such as a computer chip). The spreader plate surface area should be such that, for a prescribed flow rate of the cooling fluid flowing over the spreader plate, the heat from the heat source is able to spread to the edges of the spreader plate. Additional considerations may also be determinative of the spreader plate surface area such as packaging constraints.

Generally, however, spreader plate surface area is selected by multiplying the surface area of the heat source with the area magnification factor. The area magnification factor $\lambda = A_s/A_h$ represents a ratio of the surface area of the heat source $A_h$ with the surface area of the spreader plate $A_s$. Typical values of $\lambda$ are in the range of 8 to 12, and are generally used in calculating spreader plate surface area for a given surface area of a heat source. From the standpoint of heat removal efficiency, $\lambda$ should be as low as possible. Highly effective heat transfer surfaces such as highly conductive fins of optimized dimensions and/or the use of heat transfer augmentation means such as reticulated foam provide for relatively low values of $\lambda$. For example, in the present invention, if the surface area of the heat source is 1.5 in$^2$ and the selected area magnification factor is taken as $\lambda=8$ (for highly efficient transfer), then the surface area of the spreader plate will be 8×1.5=12 in$^2$. For a spreader plate of this area, packaging considerations could prescribe a length of the plate in the flow direction to be 4 in. Then the width of the spreader plate will be 3 in.

The number of fins and the fin length in the flow direction can be determined following calculation of fin spacing, a. For example, based on the applicable heat transfer considerations, if the fin spacing a=0.5938 in. and the fin thickness $\delta_f$=0.125 in., then the maximum number of fins n can be determined as follows. The width of the spreader plate is equal to the space occupied by n fins, $n\delta_f$, plus the space taken up by the inter-fin gaps, (n−1)a. For a spreader plate having a width of 3 inches, the number of fins can be calculated from the equation, $n\delta_f+(n-1)a=3$ in. Using $\delta_f$=0.125 in., a=0.5938 in., and solving for n, the number of fins is equal to 5.

In preferred heat sinks of the present invention, the fin spacing a, that is equal to the foam width, and fin height b, that is equal to the foam height, are optimized according to the following formulas. Based on heat transfer considerations, the optimum fin height (as shown in FIGS. 2A and 3A) b, is determined using the relation, $$b = 0.6498 \sqrt{\frac{k_f \delta_f}{h}} \tag{1}$$

where, $k_f$ is the thermal conductivity of the selected fin material, Btu/ft s°F.

$\delta_f$ is the fin thickness, ft h is the convective heat transfer coefficient for the foam-filled space bounded by the fins and the spreader plate, Btu/ft$^2$ s °F., and where h is given by the formula, $$h = 1.2704 \left[\frac{n^{0.50}}{(1-\phi)^{0.25}}\right] \left(\frac{\rho^{0.50} k^{0.63} c_p^{0.37}}{\mu^{0.13}}\right) u_m^{0.50} \tag{2}$$

where, n is the linear density of the foam material, pores per ft $\phi$ is the foam porosity expressed as a fraction $\rho$ is the density of the flowing fluid, lb$_m$/ft$^3$ k is the thermal conductivity of the flowing fluid, Btu/ft s °F.

$c_p$ is the isobaric specific heat of the flowing fluid, Btu/lb$_m$ °F.

$\mu$ is the dynamic viscosity of the flowing fluid, lb$_m$/ft s $u_m$ is the mean velocity of the flowing fluid, ft/s.

According to the present invention, the optimum fin spacing (as shown in FIGS. 2A and 3B), a, is determined by the relationship, $$a = \Phi \delta \tag{3}$$

where, $\Phi$ is a numerical factor whose values, determined by numerical experimentation and measurements, range between about 1 to about 6, and $\delta$ is the minimum fin spacing, ft.

The preferred value of $\Phi$ is about 2.5. However, depending on heat dissipation and pressure drop considerations, higher values of $\Phi$ may be employed.

Based on heat transfer considerations, the minimum fin spacing $\delta$ is determined by the relation, $$\delta = 7.32 \sqrt{\frac{kc}{\rho c_p u_m}} \tag{4}$$

where, c is the fin length in the flow direction, ft k is the thermal conductivity of the flowing fluid, Btu/ft s °F.

ρ is the density of the flowing fluid $lb_m/ft^3$ $c_p$ is the isobaric specific heat of the flowing fluid, $Btu/lb_m°F$.

$u_m$ is the mean velocity of the flowing fluid, ft/s.

In the alternative embodiment as shown in FIGS. 3A and 3B, an array of interrupted blocks fill the width in-between the fins and along at least a portion of the length of the fins to replace a single continuous foam block as shown in FIGS. 2A and 2B. In this embodiment, the foam length x of an individual short-length block in the flow direction that is needed to maintain a high heat transfer coefficient is related to the fin spacing a (and foam block width) and fin height b (and foam block height). The length x is determined according to the following relationships. First, the thermal boundary thickness $\delta_t$ growing from the fin walls is determined as follows, $$\delta_t = 3.66 \sqrt{\frac{kx}{\rho c_p u_m}} \quad (5)$$

where, x is the interrupted foam block length in the flow direction (as shown in FIG. 3A), ft k is the thermal conductivity of the flowing fluid, Btu/ft s °F.

ρ is the density of the flowing fluid $lb_m/ft^3$ $c_p$ is the isobaric specific heat of the flowing fluid, $Btu/lb_m°F$.

$u_m$ is the mean velocity of the flowing fluid, ft/s that is related to the mass flow rate $\dot{m}$ (lb/s) as, $$\dot{m} = \rho u_m A_c \phi 2/3 = \rho u_m ab\phi 2/3 \quad (6)$$

where, $A_c$ is the cross sectional area of the foam block normal to the flow direction, $ft^2$ φ is the foam porosity expressed as a fraction a is the width of the foam block, ft b is the height of the foam block, ft.

Introducing Eq. (6) into Eq. (5) to eliminate $u_m$, $$\delta_t = 3.66 \sqrt{\frac{kabx\phi^{2/3}}{\dot{m}c_p}} \quad (7)$$

To optimize heat transfer in a device of the present invention, it has been determined that the thermal boundary layer thickness $\delta_t$ growing from the fin wall should not exceed the value of 0.5a. Also, it has been determined that minimizing the thermal boundary layer thickness will maximize heat transfer. In addition, it has been determined that the practical minimum value of $\delta_t$ is about 5% of its maximum value, or about 0.025a. Accordingly, it is preferred that the range for the length x be selected for $\delta_t$ greater than about 0.025a, more preferred that the length x be selected for a $\delta_t$ less than about 0.05a and most preferred that the length x be selected for $\delta_t$ equal to about 0.025a. By introducing each of these value of $\delta_t$ into Eq. (7), the preferred range for x is thus determined according to the following:

$$4.6657 \times 10^{-5} \frac{\dot{m}c}{k\phi^{2/3}} \left(\frac{a}{b}\right) \leq x \leq 1.8663 \times 10^{-4} \frac{\dot{m}c_p}{k\phi^{2/3}} \left(\frac{a}{b}\right) \quad (8)$$

To maximize thermal conduction from the heat source through the spreader plate into the fins and foam, the fins and foam are bonded to one another and the spreader plate. While thermal bonding such as brazing is preferred, any suitable means may be employed including, for example, using a conductive epoxy to form an adhesive bond. A suitable thermally conductive epoxy is, for example, Thermaxx 2600K available from Ablestick, Inc. In preferred heat sinks of the present invention, the fins, the foam blocks and the spreader plate are assembled and then preferably furnace-brazed to bond the foam to the fins and the spreader plate.

The spreader plate and fins are solid and made from thermal conducting materials known in the art. The reticulated foam is an open cell media and also made from known thermal conducting materials. Preferred thermal conducting materials include aluminum, copper, graphite and aluminum-nitride ceramics. The spreader plate, fins and the reticulated foam may be selected from the same or different materials. In a preferred embodiment, the selected thermal conducting material for the spreader plate, fins and the reticulated foam is aluminum.

The reticulated foam structure is available from commercial sources or may be made by methods known in the art. Suitable processes for making metal foams are disclosed in U. S. Pat. Nos. 3,616,841 and 3,946,039 to Walz, and processes for making ceramic foams are disclosed in U.S. Pat. No. 4,808,558, the teachings of which are incorporated herein by reference. Reticulated foam metal can be formed by the manufacturer to have many shapes, densities and cell sizes. Foam blocks as used herein may be obtained from such manufacturers or cut from larger pieces. Aluminum foams suitable for use herein are available under the tradename DUOCEL from Energy Research and Generation, Inc., Oakland, Calif.

The following examples are provided to illustrate heat sinks of the present invention designed for microelectronic cooling applications using the relationships set forth above and based upon a power dissipation requirement of up to about 200 watts.

EXAMPLE 1

In a heat sink of the present invention having single continuous foam blocks, aluminum fins are selected having a thickness $\delta_f$=0.125 inches (0.0104 ft) with thermal conductivity $k_f$=133 Btu/ft hr°F. (0.0369 Btu/ft s °F.). The fin length c in the flow direction, dictated by the packaging and heat dissipation consideration, is 4 inches (0.3333 ft). A commercially available open cell aluminum foam with linear density of n=20 pores per inch (240 pores/ft) and a porosity φ=0.90 is also selected. The cooling medium is ambient air flowing with a mean velocity $u_m$=10 ft/s. The transport properties of the ambient air are as follows:

Density ρ=0.0749 $lb_m/ft^3$

Thermal conductivity k=0.0000041 Btu/ft s °F.

Isobaric specific heat $c_p$=0.2410 $Btu/lb_m°F$.

Dynamic viscosity μ=0.0000123 $lb_m/ft$ s.

To determine optimum fin height b, the convective heat transfer coefficient h is first determined using Equation (2), above, providing h=0.0313 $Btu/ft^2s$ °F. Next, introducing this value of h into Equation (1), above, we obtain the optimum fin height b=0.0721 ft. (0.8646 inches).

To determine the optimum fin spacing a, the minimum fin spacing δ is first determined using Equation (4), to obtain δ=0.0201 ft. (0.2417 inches). Then, using Equation (3) and selecting the factor Φ=2.5 results in an optimum fin spacing a=0.6043 inches.

EXAMPLE 2

This example is the same as Example 1 except that the fin material has been changed from aluminum to copper. The copper fins have a thickness $\delta_f$=0.125 inches (0.0104 ft) and thermal conductivity $k_f$=226 Btu/ft hr °F. (0.0628 Btu/ft s °F.). The fin length c in the flow direction, dictated by the packaging and heat dissipation consideration, is 4 inches (0.3333 ft). The reticulated foam is a commercially available open cell aluminum foam having a linear density n=20 pores per inch (240 pores/ft) and a porosity $\phi$=0.90. The cooling medium is ambient air flowing with a mean velocity $u_m$=10 ft/s. The transport properties of the ambient air are as follows.

Density $\rho$=0.0749 $lb_m/ft^3$

Thermal conductivity k=0.0000041 Btu/ft s °F.

Isobaric specific heat $c_p$=0.2410 Btu/$lb_m$°F.

Dynamic viscosity $\mu$=0.0000123 $lb_m$/ft s.

As in Example 1, using Equation (2), the convective heat transfer coefficient h=0.0313 Btu/ft² s °F. Then, using Equation (1), we obtain the optimum fin height b=0.0939 ft (1.1271 inches). This optimal height of the copper fin is 30% higher than that for the aluminum fin indicating that for the same fin thickness, the copper fin has higher heat dissipation potential than aluminum fin. This can be attributed to the higher thermal conductivity of copper.

Optimum fin spacing a follows Example 1. The minimum fin spacing $\delta$ is first determined using Equation (4), to obtain $\delta$=0.0201 ft. (0.2417 inches). Then, using Equation (3) and selecting the factor $\Phi$=2.5 results in an optimum fin spacing a=0.6043 inches.

EXAMPLE 3

In a heat sink of the present invention having an array of interrupted foam blocks, where a/b=1, and the foam has a porosity $\phi$=0.9, the length x is determined using Eq. (8). With air as the cooling fluid, having an isobaric specific heat $c_p$=0.2410 Btu/$lb_m$ °F., thermal conductivity k=0.000248 Btu/min ft °F. and a mass flow rate through the foam block $\dot{m}$=1 $lb_m$/min., a preferred range for x is about 0.5837 inches to about 2.3348 inches.

EXAMPLE 4

For the same heat sink as in Example 3, using water as the cooling fluid, having an isobaric specific heat $c_p$=1 Btu/$lb_m$ °F., thermal conductivity k=0.00578 Btu/min ft °F. and a mass flow rate $\dot{m}$=0.25 $lb_m$/min., a preferred range for x is about 0.0260 inches to about 0.1040 inches.

While the preferred embodiment of the present invention has been described so as to enable one skilled in the art to practice the heat sinks disclosed, it is to be understood that variations and modifications may be employed without departing from the concept and intent of the present invention as defined by the following claims. The preceding description and examples are intended to by exemplary and should not be read to limit the scope of the invention. The scope of the invention should be determined only by reference to the following claims.

What is claimed is:

1. A heat sink for an electronic component comprising:
a heat spreader plate having a length and one surface suitable for connection with an electronic component and a flat area on an opposite surface;
at least two heat conducting fins mounted substantially perpendicular to said flat area of said plate and being positioned substantially parallel to one another continuously along said length of said plate; and
an array of porous heat conducting reticulated foam blocks positioned between said at least two heat conducting fins and affixed thereto, said foam blocks being spaced one from another along said length of said plate to define a gap between each two adjacent foam blocks with said gap extending between said fins for improving a heat transfer coefficient of said heat sink.

2. A heat sink of claim 1 wherein a height of said heat conducting fins, b, is determined by the relationship, $$b = 0.6498 \sqrt{\frac{k_f \delta_f}{h}}$$

where, $k_f$ is the thermal conductivity of the selected fin material, Btu/ft s °F $\delta_f$ is the fin thickness, ft h is the convective heat transfer coefficient for said heat conducting reticulated foam-filled space bounded by said fins and said heat spreader plate, Btu/ft² s °F, and where h is given by the formula, $$h = 1.2704 \left[\frac{n^{0.50}}{(1-\phi)^{0.25}}\right]\left(\frac{\rho^{0.50} k^{0.63} c_p^{0.37}}{\mu^{0.13}}\right) u_m^{0.50}$$

where, n is the linear density of said heat conducting reticulated foam material, pores per ft $\phi$ is the foam porosity expressed as a fraction $\rho$ is the density of a fluid to flow through said foam, $lb_m/ft^3$ k is the thermal conductivity of said flowing fluid, Btu/ft s °F $c_p$ is the isobaric specific heat of said flowing fluid, Btu/$lb_m$/°F $\mu$ is the dynamic viscosity of said flowing fluid, lb/ft s $u_m$ is the mean velocity of said flowing fluid, ft/s.

3. A heat sink of claim 1 wherein a fin spacing, a, is determined by the relationship, $$a = \phi \delta$$

where, $\Phi$ is between 1 to 6

$\delta$ ft, is determined by the relation, $$\delta = 7.32 \sqrt{\frac{kc}{\rho c_p u_m}}$$

where, c is a selected fin length extending along a flow direction of a fluid being passed therealong, ft k is the thermal conductivity of said fluid, Btu/ft s °F $\rho$ is the density of said fluid $lb_m/ft^3$ $c_p$ is the isobaric specific heat of said fluid, Btu/$lb_m$°F $u_m$ is the mean velocity of said fluid, ft/s.

4. A heat sink of claim 1 wherein a length of said heat conducting reticulated foam block, x, extending along a flow direction of a fluid being passed therealong is selected from the range defined by, $$4.6657 \times 10^{-5} \frac{\dot{m} c_p}{k \phi^{2/3}} \left(\frac{a}{b}\right) \leq x \leq 1.8663 \times 10^{-4} \frac{\dot{m} c_p}{k \phi^{2/3}} \left(\frac{a}{b}\right)$$

where, $\phi$ is a porosity of said foam blocks expressed as a fraction $\rho$ is the density of said fluid, $lb_m/ft^3$ k is the thermal conductivity of said fluid, Btu/ft s °F $c_p$ is the isobaric specific heat of said fluid, Btu/$lb_m$ °F $\dot{m}$ is the mass flow rate of said fluid, lb/s a is a width of said foam block, ft b is a height of said foam block, ft.

5. A heat sink of claim 1 wherein said heat spreader plate, said fins and said heat conducting reticulated foam blocks are fabricated of one of the group of aluminum, copper, graphite or aluminum-nitride ceramic.

6. A heat sink of claim 1 wherein said heat spreader plate, said fins and said heat conducting reticulated foam blocks are made from aluminum.

7. A heat sink of claim 1 wherein a height of said porous heat conducting reticulated foam blocks is substantially equal to a height of said heat conducting fins.

8. A heat sink of claim 1 wherein a length of said porous heat conducting reticulated foam blocks is substantially equal as measured parallel to said heat conducting fins.

9. A heat sink of claim 1 comprising a plurality of heat conducting fins parallel one to the other and connected to said flat surface of said heat spreader plate, each pair of adjacent ones of said fins defining a space therebetween, and wherein said array of said porous heat conducting reticulated foam blocks comprises at least two of said heat conducting reticulated foam blocks positioned in each said space such that said at least two heat conducting reticulated foam blocks are spaced one from the other thereby defining a gap therebetween extending from a first fin of said pair of adjacent fins to a second fin of said pair of adjacent fins.

10. A heat sink of claim 9 wherein said plurality of heat conducting fins are substantially equally spaced.

11. A heat sink of claim 10 wherein a height of said porous heat conducting reticulated foam blocks is substantially equal to a height of said heat conducting fins.

12. A heat sink of claim 1 wherein said gap exposes at least a portion of said flat area of said plate.

13. A heat sink of claim 1 wherein said gap extends continuously between said fins.

* * * * *